(12) United States Patent
Sagawa

(10) Patent No.: US 6,522,125 B2
(45) Date of Patent: *Feb. 18, 2003

(54) TRAY TRANSFER ARM, ELECTRONIC COMPONENT TESTING APPARATUS AND TRAY TRANSFER METHOD

(75) Inventor: Makoto Sagawa, Tokyo (JP)

(73) Assignee: Advantest Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/309,306

(22) Filed: May 11, 1999

(65) Prior Publication Data

US 2001/0054891 A1 Dec. 27, 2001

(30) Foreign Application Priority Data

May 11, 1998 (JP) .............................. 10-127697
Apr. 20, 1999 (JP) .............................. 11-112860

(51) Int. Cl.[7] ............................................ G01R 31/02
(52) U.S. Cl. ..................................... 324/158.1; 324/765
(58) Field of Search .............................. 324/158.1, 754, 324/758, 765; 220/908, 909

(56) References Cited

U.S. PATENT DOCUMENTS

| 4,320,851 A | * | 3/1982 | Montoya ..................... 220/908 |
| 4,723,686 A | * | 2/1988 | Pennisi ........................ 220/908 |
| 5,004,114 A | * | 4/1991 | Terbrusch et al. .......... 220/908 |
| 5,088,190 A | * | 2/1992 | Malhi et al. .................. 29/843 |
| 5,539,324 A | * | 7/1996 | Wood et al. ................ 324/758 |
| 5,945,834 A | * | 8/1999 | Nakata et al. .............. 324/758 |

* cited by examiner

Primary Examiner—Ernest Karlsen
(74) Attorney, Agent, or Firm—Birch, Stewart, Kolasch & Birch, LLP

(57) ABSTRACT

A tray transfer arm which is widely used regardless of kinds of customer trays and capable of maintaining the stability of holding ICs to be tested. The tray transfer arm for transferring customer trays KST loaded with a plurality of ICs to be tested comprises a cover plate for covering the opening surface of a pocket of the tray.

16 Claims, 12 Drawing Sheets

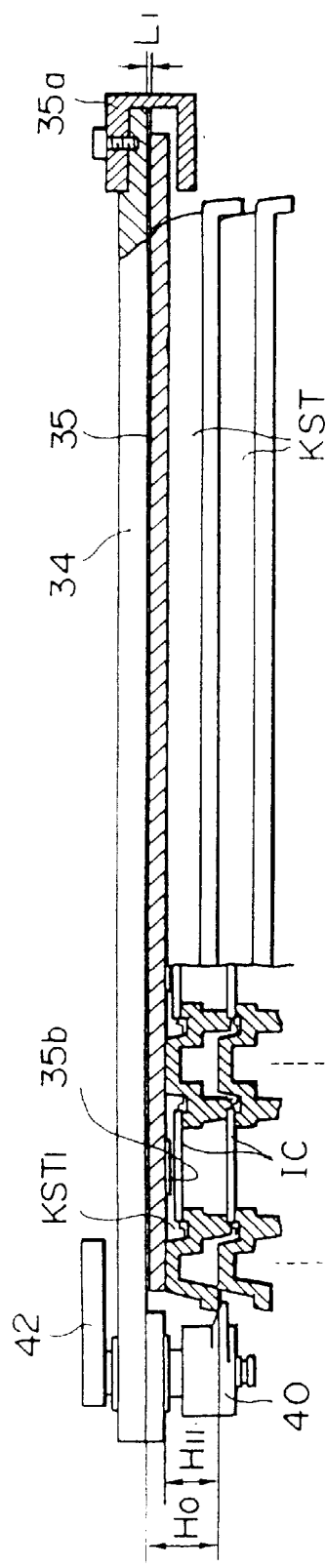
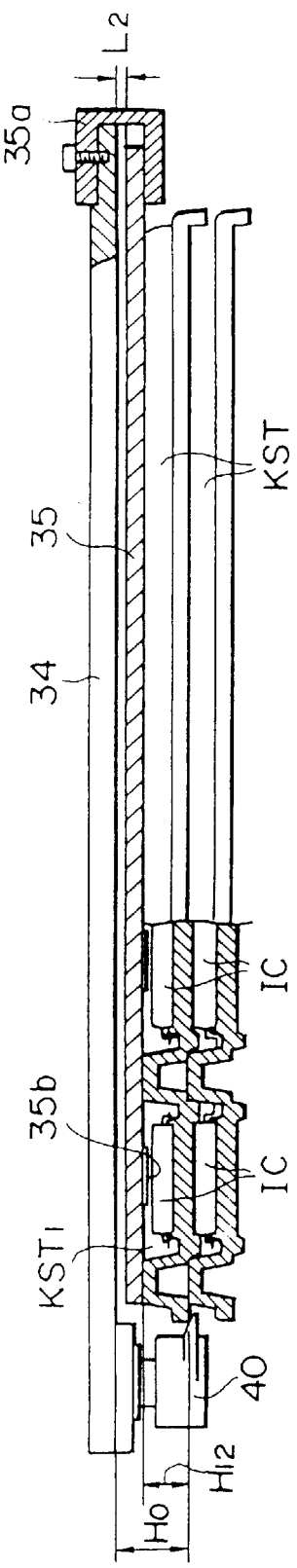
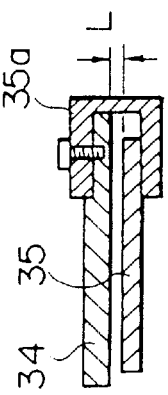

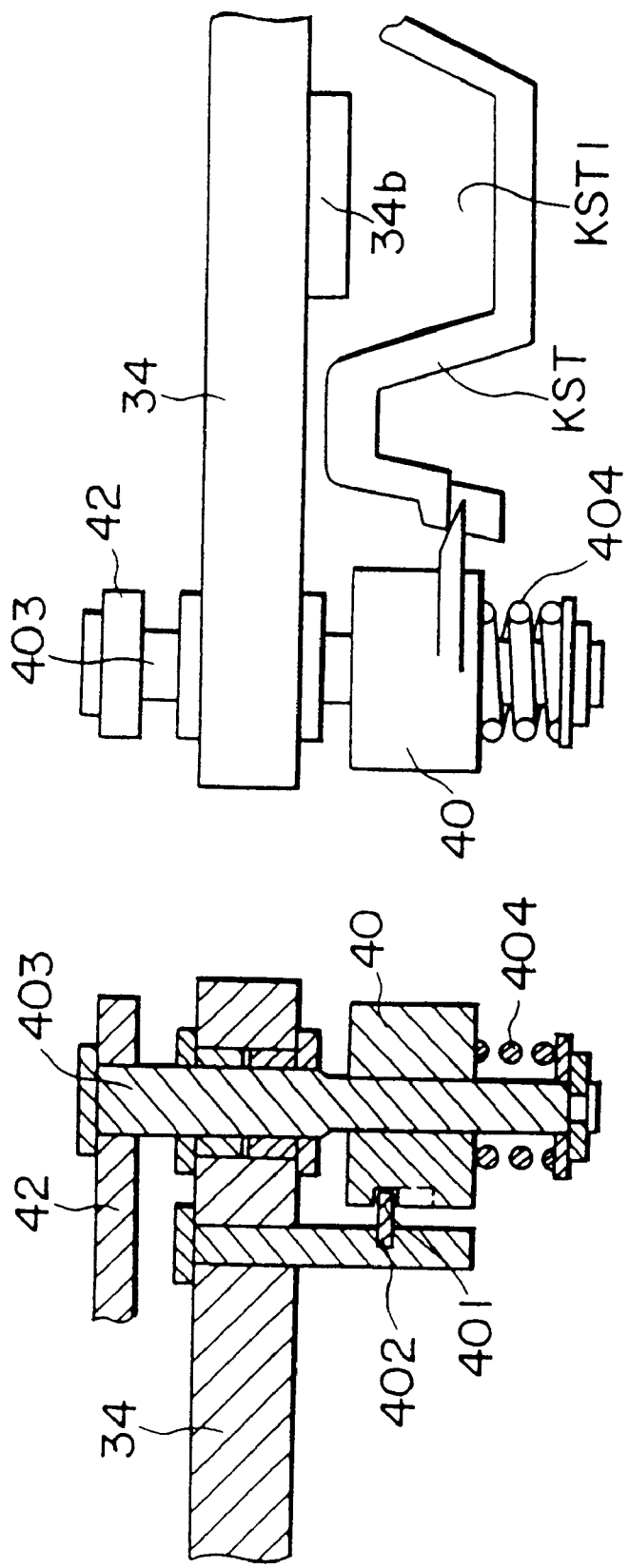

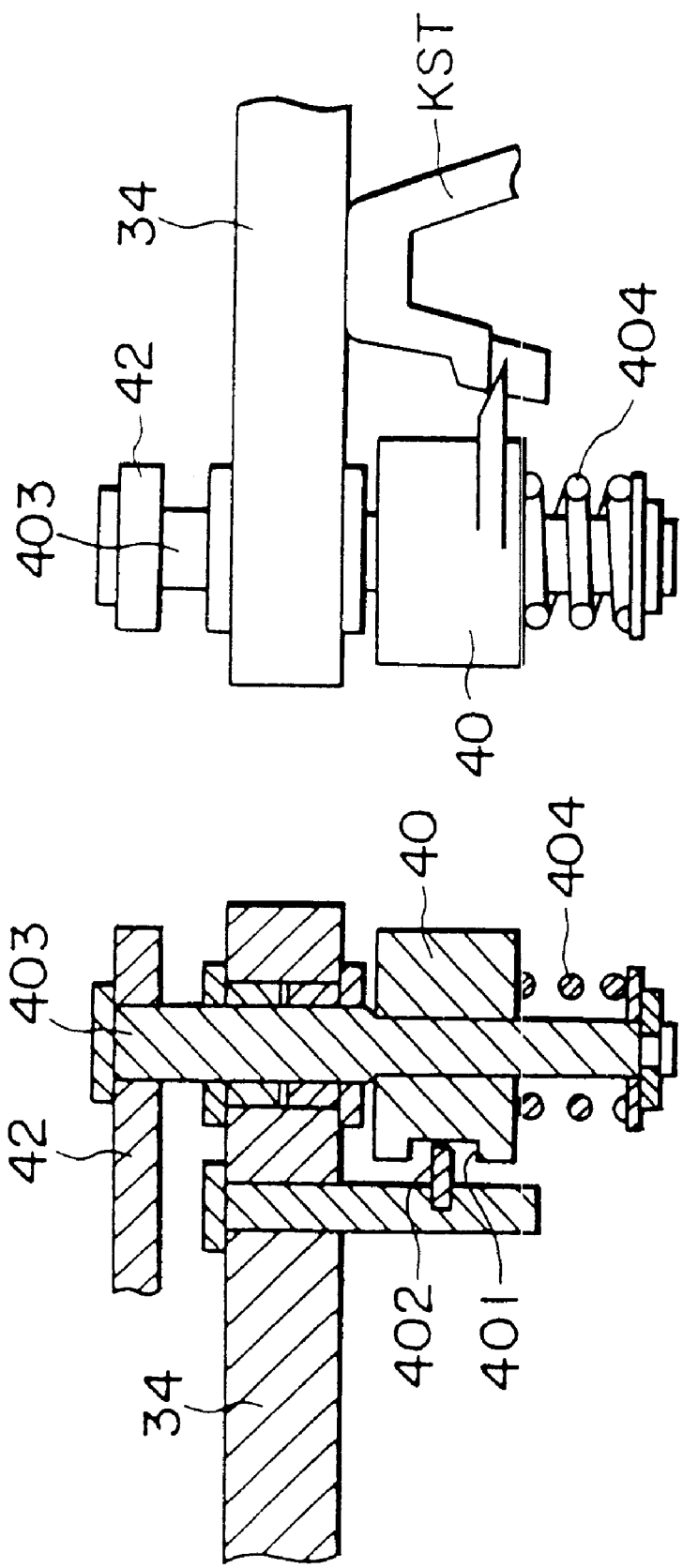

TRAY TRANSFER ARM, ELECTRONIC COMPONENT TESTING APPARATUS AND TRAY TRANSFER METHOD

BACKGROUND OF THE INVENTION

1. Field of the Invention

The present invention relates to an electronic component testing apparatus for testing a variety of electronic components, such as semiconductor integrated circuit devices (hereinafter referred to as an "IC" or "ICs"), a tray transfer arm used therefor and a tray transfer method. More particularly, the invention relates to a general purpose tray transfer arm able to maintain stability in holding electronic components regardless of kinds of customer trays, electronic component testing apparatus and a tray transfer method.

2. Description of the Related Art

An electronic component testing apparatus called a "handler" conveys a large number of ICs held on a tray to the inside of a testing apparatus where the ICs are made to electrically contact a test head, then the IC testing unit is made to perform the test. When the test is ended, the ICs are conveyed out from the test head and reloaded on trays in accordance with the results of the tests so as to classify them into categories of good ICs and defective ones.

In a handler of the related art, the trays for holding the DUTs (Devices under test) to be tested or the tested DUTs (hereinafter referred to the "customer trays") and the trays conveyed inside the Electronic component testing apparatus (hereinafter referred to as the "test trays") are different, therefore, the ICs are switched between the customer trays and the test trays before and after the test.

When switching the tested ICs from the test trays to the customer trays, empty customer trays are prepared for the number of categories of good ICs and defective ones, etc., to which the tested ICs are reloaded from the test trays. When the customer trays are filled up, it is necessary to convey the reloaded ICs to prepare new empty customer trays. Thus, a transfer apparatus called a tray transfer arm is provided in the electronic component testing apparatus.

In the tray transfer arms of the related art, as shown in FIG. 12, a customer tray KST loaded with a large number of ICs to be tested is held beneath a tray magazine plate 34. The magazine plate 34 moves in the X, Y and Z direction and thereby, the customer tray KST is transferred to a desired position.

The above test tray is regarded to be a part exclusively for the handler, while the customer tray KST varies in the shape, particularly, the illustrated thickness H (substantially, H1) and the depth D of a pocket KST1 for carrying. ICs to be tested in accordance with kinds of the customer tray KST.

Accordingly, when preparing the tray transfer arm of the handler, it has been a general way to prepare it to be fit to a customer tray having the thickest thickness H, or to switch a hook 40 for holding the tray transfer arm in accordance with kinds of the customer tray.

If the tray transfer arm is made to be fit to a shape of the customer tray having the thickest thickness H, however, the pocket KST1 is too deep as shown in FIG. 12 when holding a customer tray having thinner thickness H, consequently, a space S between the IC to be tested and the bottom surface of the magazine plate 34 becomes large and the IC to be tested is liable to be out of its position on the pocket KST1 during transferring of the customer tray.

Also, there has been a disadvantage that switching the holding hook 40 to an exclusive one in accordance with the kinds of the customer trays KST brings extremely burdensome works and requires a long time for the arrangements.

SUMMARY OF THE INVENTION

It is an object of the present invention to provide a tray transfer arm, an electronic component testing apparatus and a tray transfer method which is fully general purpose and able to maintain stability in holding electronic components to be tested regardless of kinds of customer trays.

(1-1) According to the first aspect of the present invention, there is provided a tray transfer arm for holding and transferring a tray having a pocket for loading an electronic component therein, comprising a cover plate for covering an opening surface of the pocket.

In the present invention, it is possible to cover with the cover plate the opening surface of the pocket regardless of kinds of a tray when the tray transfer arm holds and transfer the tray. As a result, the electronic components to be tested become stable without jumping out from their correctly held positions and a high speed transfer becomes attainable and disadvantages, such as a pick-up mistake in the next process, can be prevented beforehand.

The cover plate according to the present invention is not particularly limited. It also includes the tray itself other than exclusive plates. Namely, the tray can be used also as a cover plate.

(1-2) In the above invention, the position of attaching the cover plate is not particularly limited. It can be attached to the respective trays and also to the tray transfer arm. The jumping out of the DUTs from the electronic component magazine easily occurs mainly during transferring at a high speed, which can be prevented simply by attaching the cover plate to the tray transfer arm.

(1-3) In the above invention, the cover plate may be provided exclusively in accordance with the shapes, etc. of the respective trays, and more preferably, the cover plate is provided movably in the vertical direction with respect to the opening surface of the tray. By doing so, one cover plate can be widely used for the trays having different shapes, such as the thickness, etc., as well. Namely, in providing a cover plate to the tray transfer arm, by giving a room (space) in the vertical direction with respect to the opening surface, the cover plate covers by contacting with the opening surface of the tray due to its own wight both when holding a thick tray and a thin tray. Accordingly, it can be used widely to different kinds of trays as far as the room permits.

(1-4) As explained above, the cover plate according to the present invention can be an exclusive part in accordance with kinds of the trays. In this case, although it is not particularly limited, it is preferable that the cover plate is provided removably to the tray transfer arm and forms a projection portion projecting toward the electronic component pocket of the tray.

In this way, even in the case of using exclusive parts in accordance with kinds of the tray, only the cover plate is parts which should be switched. Thus, comparing with the case of switching the holding hook, time for arrangements and increase in cost can be suppressed. Also, in the case of using exclusive parts, the projection portion in accordance with the electronic component to be tested can be formed on the cover plate, and it becomes possible to attain the state where stability of the electronic component to be tested can be maintained most.

(1-5) Furthermore, in the above invention, the cover plate is not necessarily a separate part. It may be the tray magazine plate itself constituting the tray transfer arm. In this case, it is preferable that, along with holding the tray, a hook mechanism for pressing the tray in the direction toward the tray magazine plate is provided.

By doing so, the opening surface of trays having different shapes, such as the thickness, etc., can be pressed to contact with the tray magazine plate, and the electronic components to be tested become stabilized without jumping out from the correctly held position. Therefore, a high speed transfer becomes possible and disadvantages, such as a pick-up mistake, etc. in the next process, can be prevented beforehand.

Also, by forming on the tray magazine plate a projection portion projecting toward the electronic component pocket of the tray, stability of the loaded electronic components to be tested increases furthermore.

(2) According to the second aspect of the present invention, there is provided an electronic component testing apparatus, comprising a tray magazine for carrying therein a tray having a pocket for loading an electronic component to be tested therein and a tray transfer arm for transferring the tray carried in the tray magazine to a loader section, wherein the tray transfer arm comprises a cover plate for covering an opening surface of the pocket.

Also, there is provided an electronic component testing apparatus, comprising a tray magazine for carrying therein a tray having a pocket for loading an electronic component therein, and a tray transfer arm for transferring a tray loaded with post-test electronic components at an unloader section to said tray magazine, wherein the tray transfer arm comprises a cover plate for covering an opening surface of the pocket.

(3) According to the third aspect of the present invention, there is provided a tray transfer method comprising a step for transferring a tray loaded with an electronic component to be tested in a pocket thereof, wherein the tray is transferred in a state that at least an opening surface of the pocket is covered.

In the present invention, a tray is transferred in a state that at least an opening surface of the electronic component pocket is covered when transferring the tray loaded with electronic components in the pocket wherein one primary surface has the opening, therefore, it is possible to prevent the electronic components from jumping. As a result, the electronic components are stabilized without jumping out of the correct held position, so that a high speed transfer becomes possible and disadvantages, such as a pick-up mistake, etc. in the next process, can be prevented beforehand.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

These and other objects and features of the present invention will be explained in more detail below with reference to the attached drawings which are given by way of illustration only, and thus are not limitative of the present invention, and wherein:

FIGS. 8A to 8C are sectional views (corresponding to the sectional view along the line VIII—VIII in FIG. 6) for explaining a function of the tray transfer arm of the present invention;

FIGS. 9A and 9B are sectional views of another embodiment of the tray transfer arm of the present invention;

FIGS. 10A and 10B are sectional views of another embodiment of the tray transfer arm of the present invention;

DESCRIPTION OF THE PREFERRED EMBODIMENTS

Embodiments of the present invention will be explained below based on the drawings.

Figure 1:
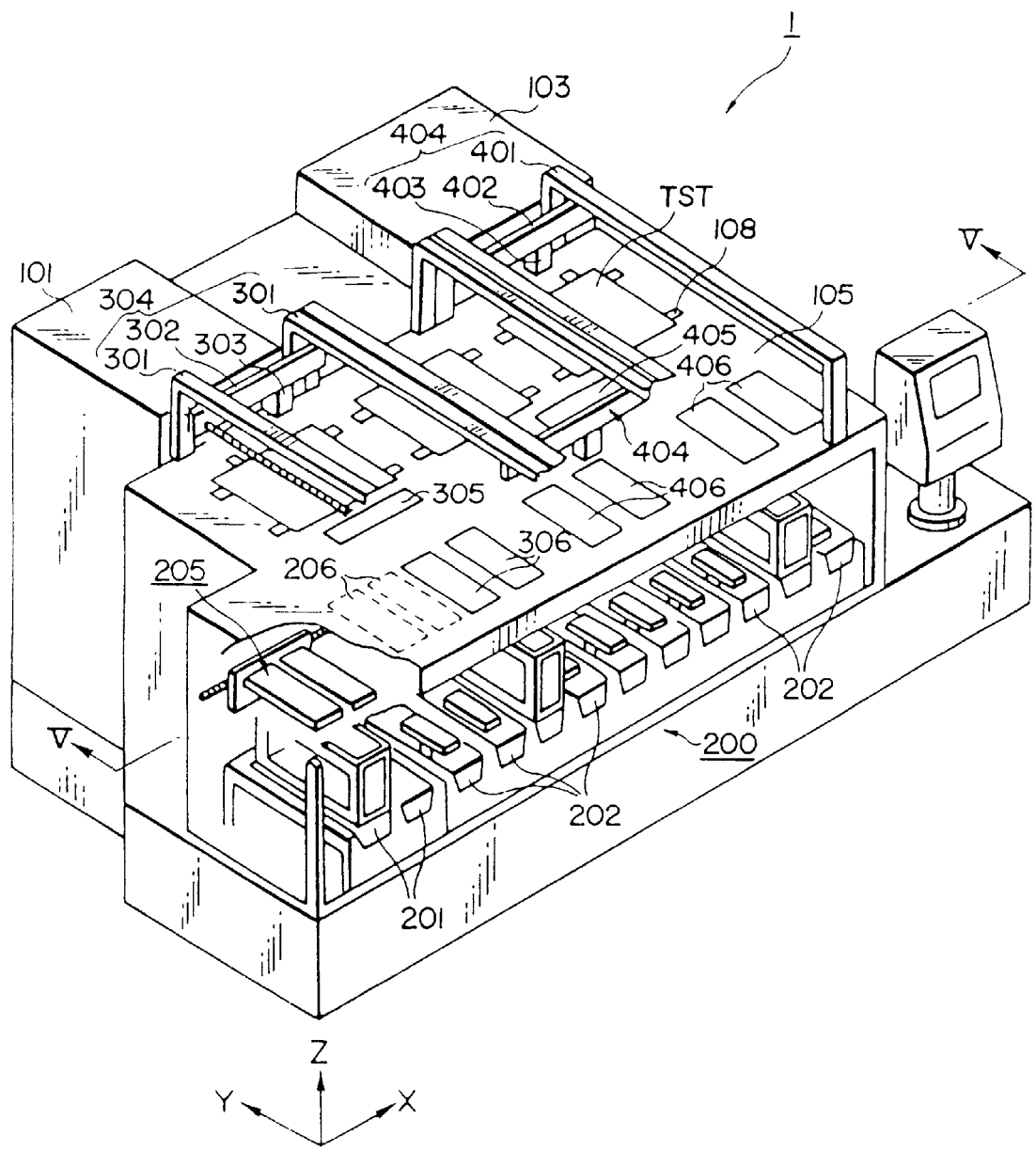
FIG. 1 is a perspective view of an embodiment of an Electronic component testing apparatus according to the present invention.
Figure 2:
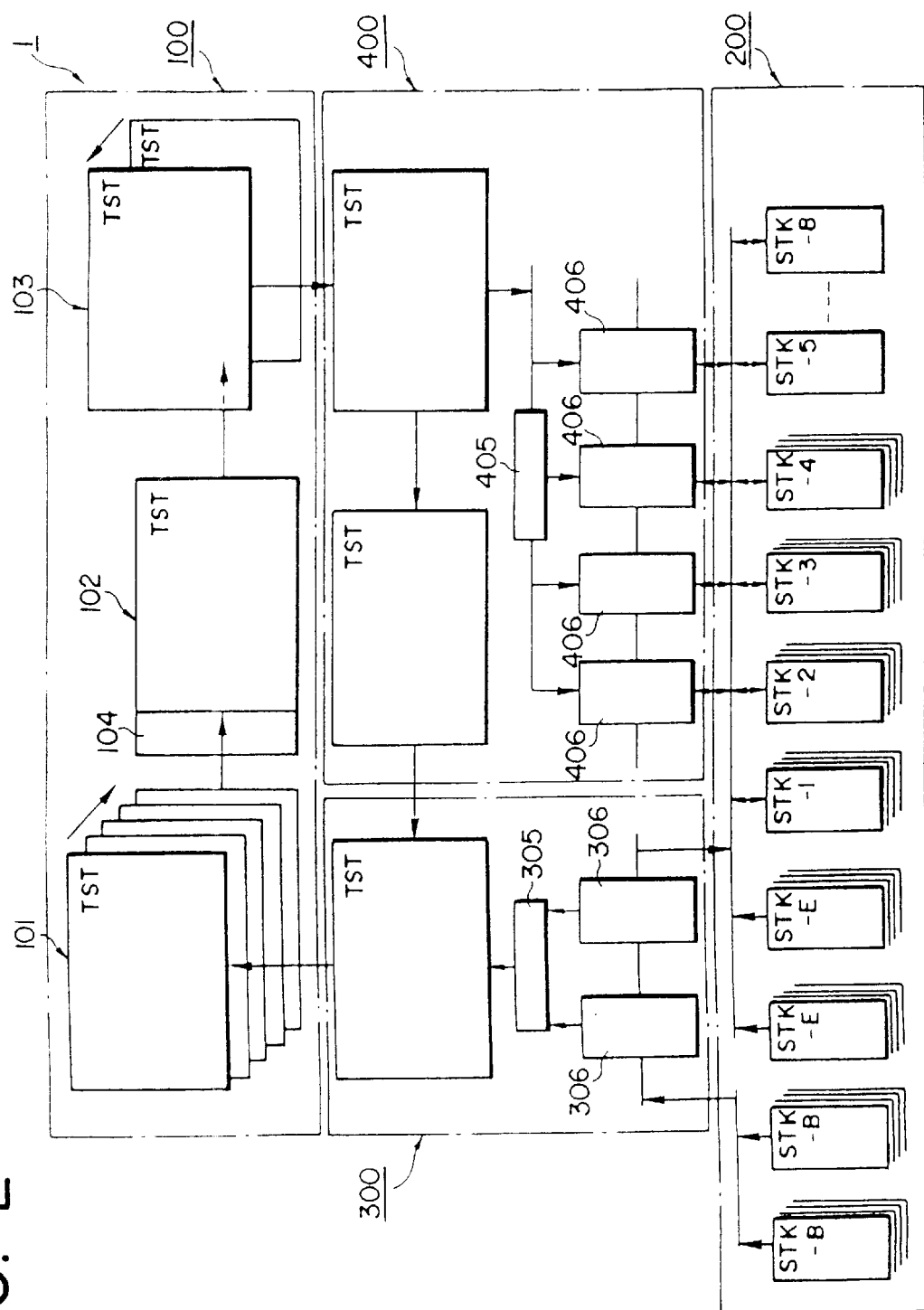
FIG. 2 is a schematic diagram of a methods of handling a tray in the Electronic component testing apparatus shown in FIG. 1.

FIG. 1 is a partially notched perspective view of an Electronic component testing apparatus wherein a tray transfer arm of the present invention is comprised, and FIG. 2 is a schematic view for explaining the method of handling a tray in the Electronic component testing apparatus. Note that FIG. 2 is a view for understanding the method of handling the tray in the Electronic component testing apparatus of the present embodiment, in which members actually aligned in the vertical direction is partially shown by a plan view. Therefore, the mechanical (three-dimensional) structure will be explained with reference to FIG. 1.

The Electronic component testing apparatus 1 of the present embodiment 1 comprises, as shown in FIG. 1 and FIG. 2, a chamber section 100 including a test head, a tray magazine 200 for storing ICs to be tested from now and also classifying and storing tested ICs, a loader section 300 for conveying the IC to be tested to the chamber section 100, and an unloader portion 400 for classifying and taking out the ICs tested in the chamber section 100.

Note that, in the following explanation, a case where the tray transfer arm 205 of the present invention is applied to an Electronic component testing apparatus 1 of a chamber form will be shown, however, the tray transfer arm of the present invention can be applied to any handlers as far as they transfer a tray loaded with ICS to be tested (hereinafter also referred to as a customer tray KST), and which is not limited to the chamber form Electronic component testing apparatus described below and can be applied, for example, to an Electronic component testing apparatus in a heat plate form.

Chamber Section 100

The Electronic component testing apparatus 1 of the present embodiment tests (inspects) whether an IC operates suitably in a state applying a high temperature or low temperature thermal stress to the DUT or not applying, and classifies the DUTs in accordance with the test results. The operating test in the state with thermal stress applied is performed by reloading the DUTs from the customer tray KST carrying a large number of DUTs to be tested to a test tray TST conveyed through the inside of the Electronic component testing apparatus 1.

The test tray TST is conveyed into the chamber section 100 after being loaded with the DUTs by the loader section 300, then the DUTs are tested in a state carried on the test tray TST. Then after conveying out the tested ICs to the unloader section 400, the respective DUTs are reloaded at the unloader portion 400 to the customer tray KST in accordance with the test results.

The chamber section 100 is comprised of a constant temperature chamber 101 for giving a desired high temperature or low temperature thermal stress, or no thermal stress to the DUTs loaded on the test tray TST, a test chamber 102 for making the DUTs contact the test head in a state given the thermal stress or no thermal stress by the constant temperature chamber 101, and a soak chamber 103 for removing the given thermal stress from the DUTs tested in the test chamber 102.

In the soak chamber 103, when a high temperature was applied in the constant temperature chamber 101, the DUTs are cooled by blowing in air to return them to room temperature. Alternatively, when a low temperature of about −30° C. has been applied in the constant temperature chamber 101, it heats the DUTs by hot air or a heater etc. to return them to a temperature where no condensation occurs. Next, the thus treated DUTs are conveyed out to the unloader section 400.

As shown in FIG. 1, the constant temperature chamber 101 and soak chamber 103 of the chamber section 100 are arranged so as to project upward from the test chamber 102. Here, a test tray TST is loaded with the DUTs at the loader section 300 and conveyed to the constant temperature chamber 101. The constant temperature chamber 101 is provided with a vertical conveyor, illustration of which is omitted. A plurality of test trays TST stand by in a state supported by the vertical conveyor until the test chamber 102 becomes empty. While standing by, a high temperature or low temperature thermal stress is applied to the DUTs.

The test chamber 102 has a test head 104 arranged at its center. A test tray TST is conveyed above the test head 104 and the DUTs are tested by bringing them into electrical contact with the test head 104. The test tray TST finished being tested is treated in the soak chamber 103 to return the temperature of the ICS to room temperature, then is discharged to the unloader section 400.

In front of the constant temperature chamber 101 and the soak chamber 103 is provided a board 105 as shown in FIG. 1. This board 105 has a test tray conveyor 108 mounted on it. The test tray TST discharged from the soak chamber 103 by the test tray conveyor 108 provided on the board 105 is returned to the constant temperature chamber 101 through the unloader section 400 and the loader section 300.

Tray Magazine 200

The tray magazine 200 is provided with a pre-test IC stocker 201 for holding DUTs to be tested and a post-test IC stocker 202 for holding DUTs classified in accordance with the test results.

Figure 3:
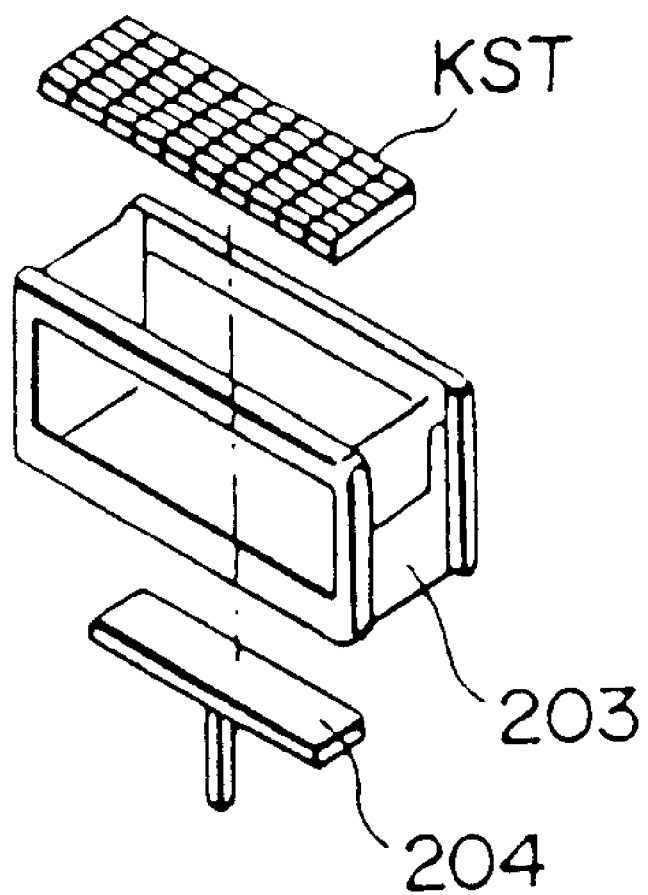
FIG. 3 is a perspective view of the structure of an IC stocker of the Electronic component testing apparatus of FIG. 1.
Figure 4:
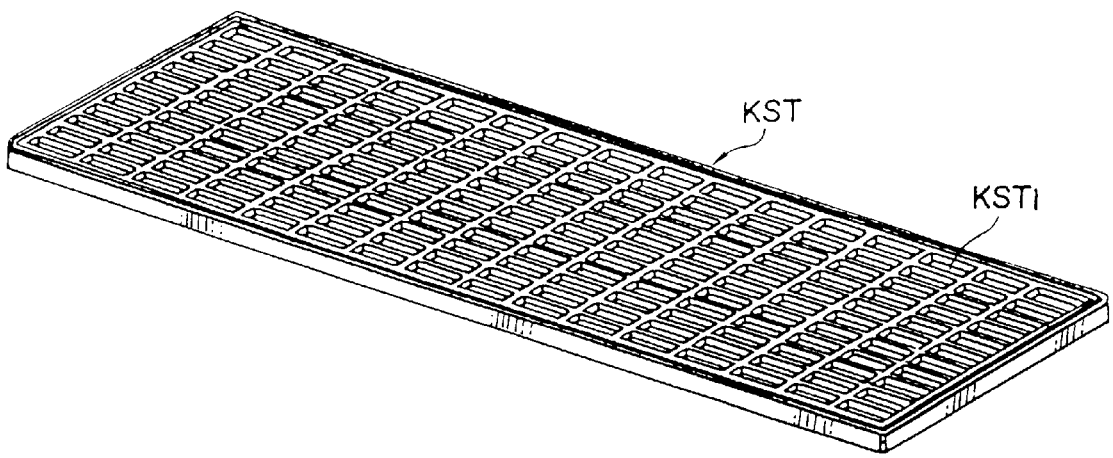
FIG. 4 is a perspective view of a customer tray used in the Electronic component testing apparatus of FIG. 1.

These pre-test IC stocker 201 and post-test IC stocker 202, as shown in FIG. 3, are each comprised of a frame-shaped tray support frame 203 and an elevator 204 able to enter from under the tray support frame 203 and move toward the top. The tray support frame 203 supports in it a plurality of stacked customer trays KST as shown in the enlarged view of FIG. 4. The stacked customer trays KST are moved up and down by the elevator 204.

The pre-test IC stocker 201 holds stacked customer trays KST on which the DUTs to be tested are held, while the post-test IC stocker 202 holds stacked customer trays KST on which DUTs finished being tested are suitably classified.

Note that since the pre-test IC stocker 201 and the post-test IC stocker 202 are structured the same, the numbers of the pre-test IC stocker 201 and the post-test IC stocker 202 may be suitably set in accordance with need. In the example shown in FIG. 1 and FIG. 2, the pre-test IC stocker 201 is provided with two stockers STK-B and provided next to that with two empty stockers STK-E to be sent to the unloader section 400, while the post-test IC stocker 202 is provided with eight stockers STK-1, STK-2, . . . , STK-8 and can hold ICS sorted into a maximum of eight classes according to the test results. That is, in addition to classifying ICS as good and defective, it is possible to divide the good ICS into ones with high operating speeds, ones with medium speeds, and ones with low speeds and the defective ICS into ones requiring retesting etc.

Loader Section 300

The above-mentioned customer tray KST is conveyed to the loader section 300, where the DUTs loaded on the customer tray KST are reloaded on the test tray TST stopped at the loader section 300.

The X-Y conveyor 304 is used as an IC conveying apparatus for reloading the DUTs from the customer tray KST to the test tray TST, as shown in FIG. 1, which is provided with two rails 301 laid over the top of the board 105, a movable arm 302 able to move back and forth (this direction designated as the Y-direction) between the test tray TST and a customer tray KST by these two rails 301, and a movable head 303 supported by the movable arm 302 and able to move in the X-direction along the movable arm 302.

The movable head 303 of the X-Y conveyor 304 has suction heads attached facing downward. The suction heads move while drawing out air to pick up the DUTs from the customer tray KST and reload the DUTs on the test tray TST. For example, about eight suction heads are provided for the movable head 303, so it is possible to reload eight DUTs at one time on the test tray TST.

Note that in a general customer tray KST, indentation pocket KST1 for loading the DUTs are formed relatively larger than the shapes of the DUTs, so the positions of the DUTs in a state held on the customer tray KST can vary largely. Therefore, if the DUTs are picked up by the suction heads and conveyed directly to the test tray TST in this state, it becomes difficult for the ICS to be dropped accurately into the IC receiving indentations formed in the test tray TST.

Therefore, in the Electronic component testing apparatus 1 of the present embodiment, an IC position correcting means called a preciser 305 is provided between the set position of the customer tray KST and the test tray TST. This preciser 305 has relatively deep indentations surrounded with inclined surfaces at their circumferential edges, so when DUTs picked up by the suction heads are dropped into these indentations, the drop positions of the DUTs are corrected by the inclined surfaces. Due to this, the positions of the eight DUTs with respect to each other are accurately set and it is possible to pick up the correctly positioned DUTs by the suction heads once again and reload them on the test tray TST and thereby reload the DUTs precisely in the IC receiving indentations formed in the test tray TST.

Figure 5:
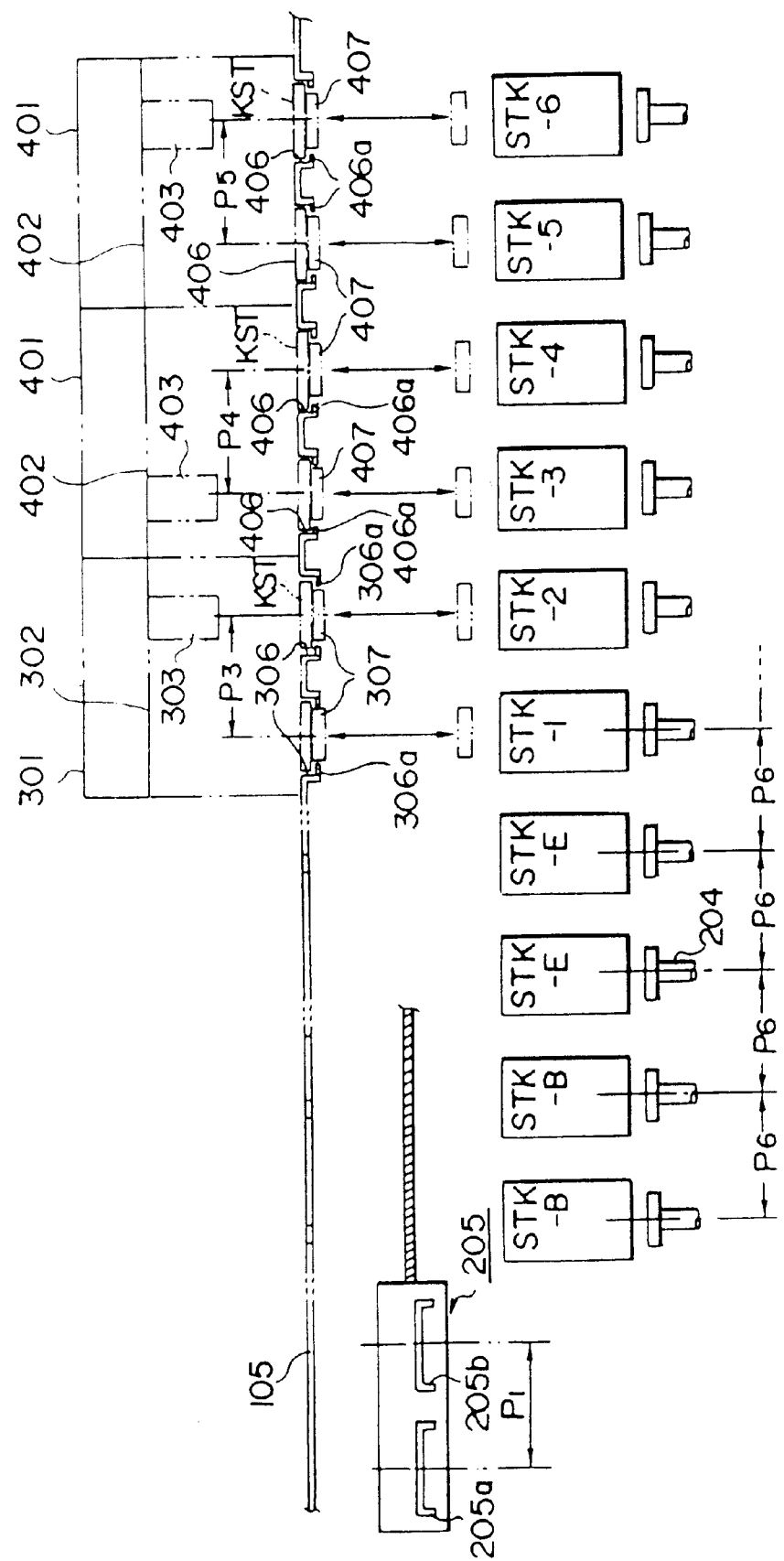
FIG. 5 is a sectional view along the line V—V of FIG. 1.

FIG. 5 is a sectional view along with the line V—V of FIG. 1, a vertical sectional view of a board 105, a tray transfer arm 205 and a tray magazine 200 which will be explained later on. As shown in FIG. 1, the board 105 of the loader section 300 is provided with a pair of openings 306, 306 arranged so that the customer trays KST carried to the loader section 300 can be brought close to the top surface of the board 105. Each of the openings 306 are provided with a holding hook 306a for holding the customer tray conveyed to the opening 306, and the customer tray KST is held in the position that the top surface thereof faces the surface of the board 105 via the opening 306.

Further, an elevator table 307 for elevating or lowering a customer tray KST is provided below the openings 306. A customer tray KST emptied after reloading of the DUTs to be tested is placed on here and lowered and the empty tray is passed to the lower tray magazine of the tray transfer arm 205.

Unloader Section 400

The unloader section 400 is provided with two X-Y conveyors 404, 404 of the same structure as the X-Y conveyor 304 provided at the loader section 300. The X-Y conveyors 404, 404 reload the post-test ICS from the test tray TST carried out to the unloader section 400 to the customer tray KST. As shown in the sectional view of the board 105, tray transfer arm 205 and tray magazine 200 of FIG. 5, the board 105 of the unloader section 400 is provided with two pairs of openings 406, 406 arranged so that the customer trays KST carried to the unloader section 400 can be brought close to the top surface of the test board 105. Each of the openings 406 is provided with a holding hook 406a for holding the customer tray conveyed to the opening 406, and the customer tray KST is held in the position that the top surface thereof faces the surface of the board 105 via the opening 406. The specific structure of the holding hook 406a is not particularly limited, and, for example, it may mechanically seize the customer tray KST, or the customer tray KST can be held by a pick up means.

Further, while not illustrated, an elevator table 407 for elevating or lowering a customer tray KST is provided below the openings 406. A customer tray KST becoming full after being reloaded with the tested DUTs is placed on here and lowered and the full tray is passed to the lower tray magazine of the tray transfer arm 205. Note that the customer tray KST can be moved up and down or lowered by the elevator 204 of the stocker STK positioned immediately beneath the respective openings instead of the elevating table 407.

Note that in the Electronic component testing apparatus 1 of the present embodiment, while there are a maximum of eight types of sortable categories, it is only possible to arrange a maximum of four customer trays KST at the openings 406 of the unloader section 400. Therefore, there is a limit of four sortable categories in real time. In general, four categories are sufficient, i.e., good ICS can be classified into high speed response devices, medium speed response devices, and low speed response devices plus defective devices, but there may also arise categories not belonging to these categories such as devices requiring retesting.

In this way, when DUTs arise which are classified into a different category than the categories given to four customer trays arranged at the openings 406 of the unloader section 400, one customer tray KST may be returned from the unloader section 400 to the tray magazine 200 and a customer tray KST to hold DUTs of the newly arising category may be transferred to the unloader section 400 in its place so as to hold these DUTs. If customer trays KST are switched in the middle of sorting work, the sorting work has to be interrupted during that time and therefore there is the problem of a reduction in the throughput. Therefore, in the Electronic component testing apparatus 1 of the present embodiment, a buffer section 405 is provided between the test tray TST and the opening 406 of the unloader section 400, and DUTs of a category rarely appearing are stored temporarily at this buffer section 405.

For example, the buffer section 405 is given a capacity able to hold 20 to 30 or so DUTs. A memory is provided for storing the category of ICS held at the IC holding locations of the buffer section 405. The categories and positions of the DUTs temporarily stored at the buffer section 405 are stored for each DUT. In the intervals of the sorting work or when the buffer section 405 has become full, customer trays KST of the categories to which the DUTs stored at the buffer section 405 belong are called up from the tray magazine 200 and the ICS are loaded on these customer trays KST. At this time, sometimes the DUTs temporarily stored at the buffer section 405 span several categories, but at this time it is sufficient to call up several customer trays KST at one time from the openings 406 of the unloader section 400 when calling up customer trays KST.

Tray Transfer Arm 205

As shown in FIG. 1, the upper portion of the pre-test IC stocker 201 and post-test IC stocker 202, there is provided a tray transfer arm 205 which moves all over the range of the pre-test stocker 201 and the post-test stocker 202 in the direction they are aligned between the board 105. In this example, since openings 306 and 406 of the loader section 300 and the unloader section 400 are formed immediately above the pre-test IC stocker 201 and post-test IC stocker 202 (without deviating in the Y-axis direction), the tray transfer arm 205 is also movable only in the directions of X-axis and Y-axis. Note that in accordance with the positional relationship of the tray magazine 200 and the loader section 300 or the unloader section 400, the tray transfer arm 205 may be made to be movable in all directions of X, Y and Z axises.

The tray transfer arm 205 is provided with a pair of tray magazines 205a and 205b for holding the customer trays KST being in an alignment to the left and the right to each other (in the X-direction), and transfers the customer trays KST between the loader section 300 and the unloader section 400 and between the pre-test IC stocker 201 and post-test IC stocker 202.

Figure 6A:
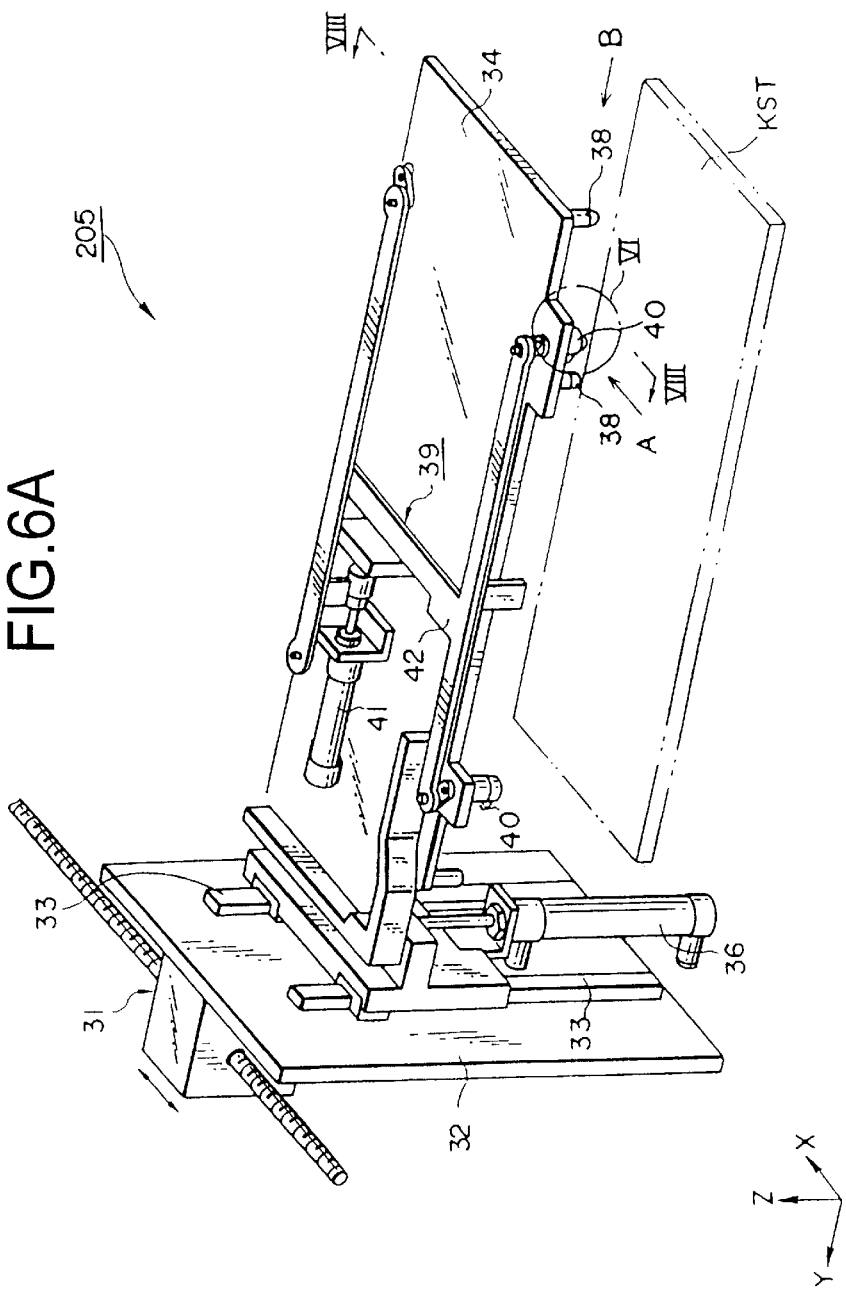
FIG. 6A is a perspective view of an embodiment of a tray transfer arm of the present invention.
Figure 6B:
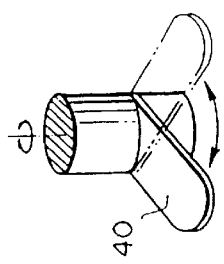
FIG. 6B is an exploded view of a hook as taken along line VI of FIG. 6A.
Figure 7A:
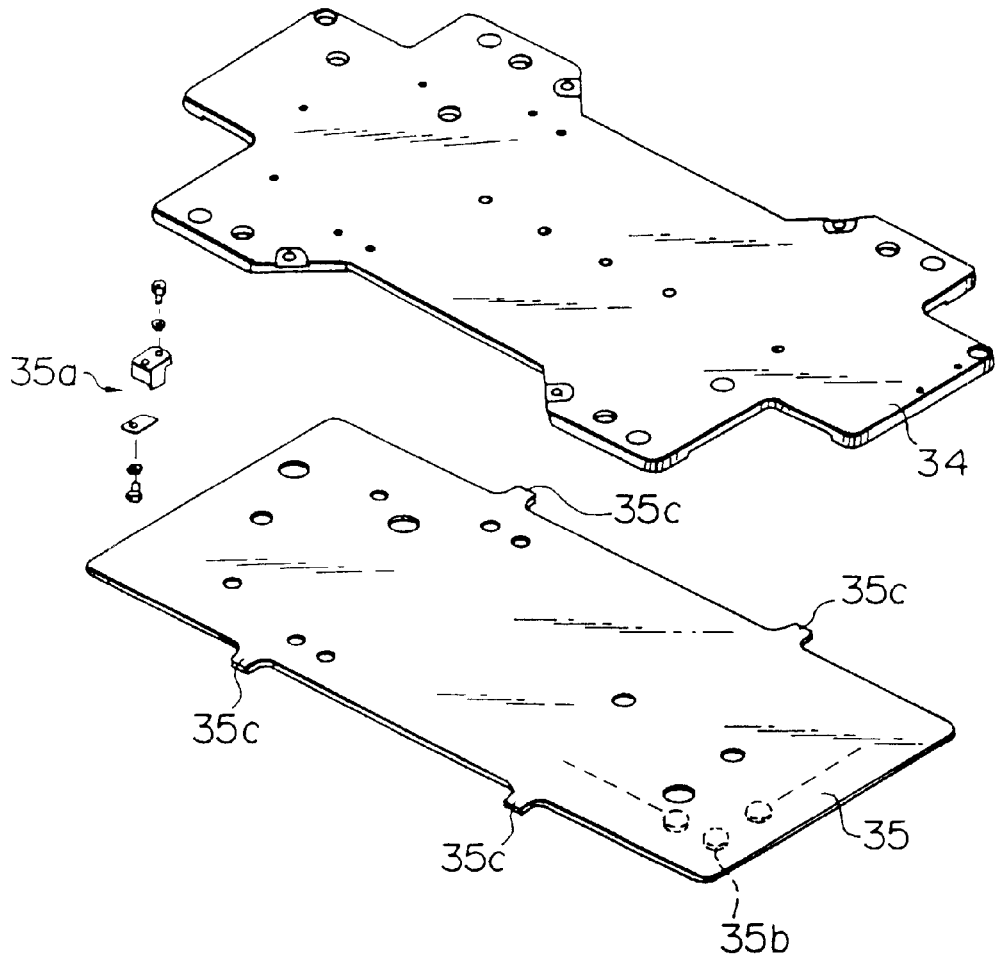
FIGS. 7A and 7B are disassembled perspective views of an embodiment of a tray transfer arm of the present invention.
Figure 7B:
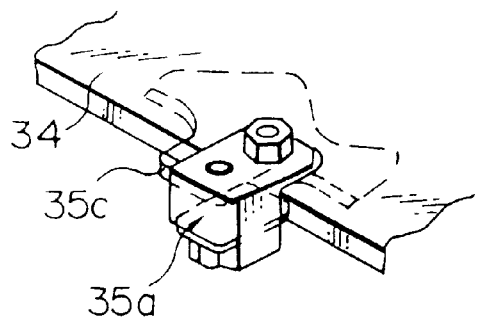

FIGS. 6A, 6B, 7A and 7B are perspective views of a specific embodiment of the tray transfer arm 205, in which FIG. 6A shows the state that the whole is combined (note that a cover plate 35 which will be explained later on is not illustrated) and FIGS. 7A and 7B shown the state of combining a magazine plate 34 and the cover plate 35.

As shown in FIG. 6A, the tray transfer arm 205 is provided with a base plate 32, which moves in the X-axis direction by a ball screw 31 functioning by being stretched in the X-axis direction, and a tray magazine plate 34 on a primary surface of the base plate 32 via a linear guide 33 being stretched in the Z-axis direction.

A rod of a first liquid pressure cylinder 36 fixed to the base plate 32 is fixed on the tray magazine plate 34, the tray magazine plate 34 moves in the Z-axis direction along with the linear guide 33 due to the operation of the first liquid pressure cylinder 36.

Also, guide pins 38 for guiding the peripheral edge of the customer tray KST are provided at proper positions on the bottom surface of the tray magazine plate 34, and the customer tray KST can be held along with the guide pins 38.

Further, since the tray magazine plate 34 holds the customer tray KST on its bottom surface, a holding hook mechanism 39 is provided so as not to drop the customer tray KST. The holding hook mechanism 39 is configured, for example as shown in FIGS. 6A and 6B, to be able to open and close (rotate by 90-degree) the hooks 40 provided at the positions corresponding to four corners of the customer tray KST by a link mechanism 42 operating in a second liquid pressure cylinder 41. Namely, the customer tray KST can be held by the tray magazine plate 34 by leaving the hook 40 open when receiving the customer tray KST and closing the hook 40 in the state of holding the customer tray KST. In the same way, the customer tray KST can be released by opening the hook 40 after being carried to a designated position in a state the hook 40 is closed.

Note that a control of the rotation drive of the ball screw 31, the first liquid pressure cylinder 36 and the second liquid pressure cylinder 41 of the holding hook mechanism 39 are performed by a control apparatus, which is also not shown in FIG. 6A.

Note that in the example shown in FIG. 6A, one tray magazine plate 34 is provided to one base plate 32. However, it can be configured to provide one more tray magazine plate 34 in the X-axis direction as shown in FIG. 1 in order to enable to transfer two customer trays KST at a time by each of the two tray magazine plates 34.

In this case, as shown in FIG. 5, it is preferable that a pitch P1 of a pair of tray magazine, pitches P3, P4 and P5 of the openings 306 and 406 of the loader section 300 and the unloader section 400 and pitch P6 of the stocker STK of the tray magazine 200 are all equally set. By doing so, it is possible to simultaneously transfer two customer trays in the same position, so the switching speed becomes higher.

Also, in the tray transfer arm 205 shown in FIG. 6A, the tray magazine plate 34 is made movable also in the Z-axis direction by the first liquid pressure cylinder 36. However, the present invention is not limited to this case and the z-axis direction may be fixed, as well.

Particularly, the tray transfer arm 205 of the present embodiment is provided with a cover plate 35 on the bottom surface of the tray magazine plate 34. While it is not illustrated in FIG. 6A, the cover plate 35 of the present embodiment is, as shown in FIG. 7A and FIG. 7B, board-shaped in which a lengthwise length and a lateral length of almost equal with those of the customer tray KST, and four flanges 35c are formed at the side edges. The flange 35c is a member used when attaching the cover plate 35 to the tray magazine plate 34 and, as shown in FIG. 7B, fixes a holding angle 35a to the tray magazine plate 34 with a bolt. The cover plate 35 is held by the tray magazine plate 34 by sandwiching the flange 35c between the holding angle 35a at this time.

The cover plate 35 is held by the holding angle 35a to the tray magazine plate 34 in this way, while in the state not holding a customer tray KST as shown in FIG. 8C, it is held by a room (space) L. By providing the room L, the cover plate 35 is made movable in the Z-axis direction by exactly the length of the room L.

Also, in the cover plate 35 according to the present embodiment, as shown in FIG. 7A, FIG. 7B and FIGS. 8A to 8C, a plurality of projection portions 35b are formed on the bottom surface, that is, the primary surface facing the top surface of the customer tray KST. The projection portions 35b are formed at positions corresponding to the positions of pockets KST1 of the customer tray, and they face the DUTs to prevent rattling when holding the customer tray KST, as shown in FIGS. 8A to 8C.

Note that the projection portions 35b is not essential to the present invention. For example, when using the cover plate 35 widely to all of the customer trays KST, the space between a DUT and a cover plate 35 is not always same in the respective customer trays KST, accordingly, it is not easy to make the projection portion 35b to be able to be widely used for all of the customer trays KST. Therefore, the projection portion 35b are omitted in such a case. On the other hand, when preparing the cover plate 35 as an exclusive member to a certain kind of customer tray group, DUTs loaded to the customer trays KST are naturally limited and the space between the DUT and the cover plate 35 are fixed. Thus, raffling inside the customer tray KST are completely prevented by forming the projection portion 35b in accordance with the shape of the DUT.

Next, the operation will be explained.

Here, with reference to FIG. 5, a sequence of operations will be explained wherein the customer tray KST loaded with pre-test ICs is set from the stocker STK-B to a pair of the openings 306 and 306 (the explanation below starts from the state that the customer tray KST is not set to the opening 306). The operation of the tray transfer arm according to the present invention is basically the same also in other sequences, so the explanation will be omitted here.

First, the tray transfer arm 205 is driven in the X-axis direction and stopped right above the pre-test stocker STK-B. Then, the elevator 204 of the pre-test stocker STK-B is elevated and the stacked customer trays KST are moved up to the tray magazine plate 34. At this time, the holding hook 40 of the tray transfer arm 205 is left open at first and closes when the customer tray KST is set to the tray magazine plate 34 by the elevator 204. Due to this, the customer tray KST can be held even if the elevator 204 lowers. The above operations may be carried out on a pair of tray magazines 205a and 205b to the right and the left to each other and also on only either one of the tray magazines 205a and 206b.

At the same time with this, or before or after this, an elevator table 307 provided at the opening 306 of the loader section 300 is moved down to be lower than the tray transfer arm 205. Then, the tray transfer arm 205 is driven in the X-axis direction and stopped right above the elevator table 307 in the lowered state.

Here, the customer tray KST held by the tray magazine plate is reloaded to the elevator table 307 either by elevating the elevating table 307 or by lowering the tray magazine plate 34 by the drive of the first liquid pressure cylinder 36. This reloading is carried out by opening the holding hook 40 of the tray transfer arm 205. Also, the above operations may be carried out on a pair of the tray magazines 205a and 205b to the right and the left to each other and also only on either one of the tray magazines 205a and 206b.

When the customer tray KST loaded with the pre-test ICs is reloaded to the elevator table 307, the elevator table 307 is elevated after moving the tray transfer arm 205 in the X-axis direction in either way, and the customer tray KST is set to the opening 306 of the loader section 300.

Due to the above sequence, the customer tray KST loaded with pre-itest ICs to be tested from now is set from the stocker STK-B to the opening 306 of the loader 300.

Here, in the tray transfer arm 205 of the DUT testing apparatus 1 of the present embodiment, since the cover plate 35 is attached to the tray magazine plate 34 leaving a room L, even when two kinds of customer trays are used, which are customer trays KST having the thickness of H11 as shown in FIG. 8A and customer trays KST having the thickness of H12 as shown in FIG. 8B (thinner than that of the customer tray KST shown in FIG. 8A), the pocket opening of the customer tray KST can be closed by the cover plate 35, so that it is possible to prevent the DUTs from jumping out.

Namely, the dimension H0 between the bottom surface of the tray magazine plate 34 and the holding hook 40 shown in FIG. 8A is set to be common in the tray transfer arm 205, and a customer tray KST having the thickest thickness is set to be a reference among the customer trays KST used in the tray transfer arm 205.

FIG. 8A shows the state that the thick customer tray KST is held. At this time, the bottom surface of the tray magazine plate 34 and the top surface of the cover plate 35 are in contact or leave only a slight space L1 between them at the holding angle 35a portion.

On the other hand, when holding a customer tray KST of a thin thickness by the same transfer arm 205, as shown in FIG. 8B, a larger space L2 than that in FIG. 8A is formed between the bottom surface of the tray magazine plate 34 and the top surface of the cover plate 35 at the holding angle 35a portion. Namely, when the board thickness of the cover plate 35 is defined as t, there is a relationship of H0=H11+t+L1=H12+t+L2.

In any cases, the cover plate 35 covers over the customer tray KST to be held and contact with the customer tray KST due to the weight of the cover plate 35 itself, so that the DUTs loaded on the pocket KST1 of the customer tray KST are free from jumping out. Especially, as shown in FIG. 8A and FIG. 8B, when the projection portion 35b is formed on the other side of the cover plate 35, raffling of the DUTs can be more surely prevented.

Also, since the cover plate 35 of the present embodiment is attached removably only by the holding angle 35a, when using customer trays KST having largely different thicknesses and when provision of the projection portion 35b is inevitable due to the large difference of the depths of the pockets KST1, other members, such as tray magazine plate 34, can be widely used only by making the cover plate 35 exclusive member.

Other Embodiments

A tray transfer arm of the present invention can be modified in a variety of ways.

Figure 11:
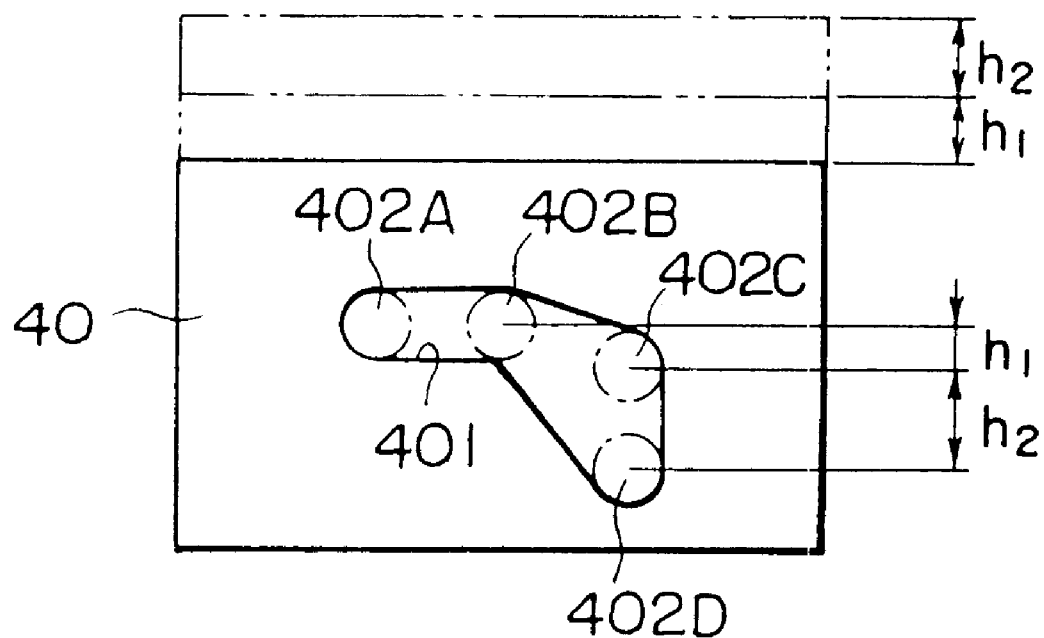
FIG. 11 is a front view of a hook shown in FIGS. 9A and 9B.
Figure 12:
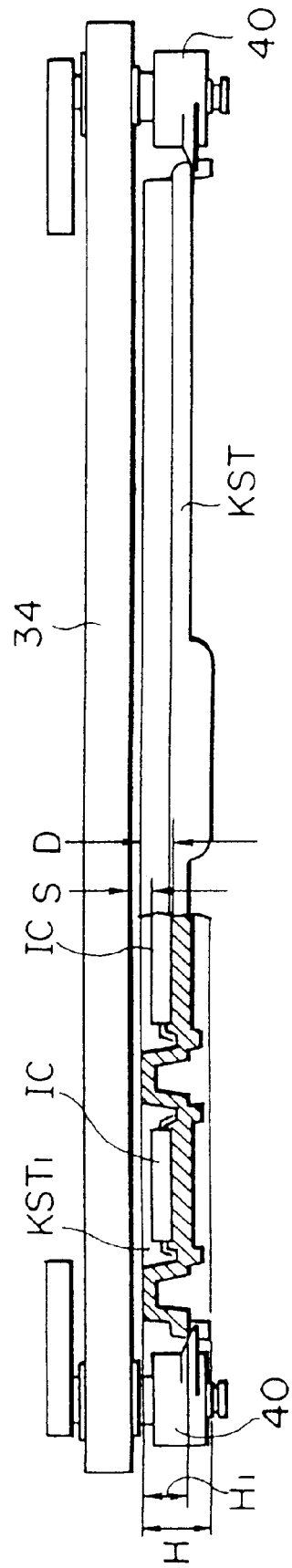
FIG. 12 is a sectional view of a tray transfer arm of the related art.

FIGS. 9A, 9B, 10A and 10B are sectional views of another embodiment of the tray transfer arm of the present invention, wherein FIGS. 9A and 10A are the views from the A direction of FIG. 6 and FIGS. 9B and 10B are views from the B direction of FIG. 6. FIG. 11 is a view of a cam groove formed on the hook 40 viewed from the front.

In the above explained embodiments, the cover plate was comprised by a separate member 35 and attached to the tray magazine plate 34, while in the present embodiment, the tray magazine plate itself is made to be a cover plate, which forms a projection portion 34b corresponding to the projection portion 35b shown in the above embodiment on the back surface of the tray magazine plate 34 as shown in FIG. 9B. This projection portion 34b is also formed at the position corresponding to the position of the pocket KST1 of the customer tray and prevents raffling by facing to a DUT when holding a customer tray KST.

Also, a hook 40 is made to be movable in the vertical direction in order to make a pocket opening contact the back surface of the tray magazine plate 34 even when the thickness of the customer trays KST differs. Namely, a cam groove 401 as shown in FIG. 11 is formed on the hook 40 and a pin 402 jointed to the cam groove 401 is fixed on the tray magazine plate 34.

As shown in FIG. 9A, a link mechanism 42 to open and close (to revolve by 90-degree) the hook 40 is provided at the upper end of the shaft 403 provided rotatably to the tray magazine plate 34, and the hook 40 is inserted to the lower end portion of the shaft 403 formed to have a partially plain surface. When the shaft 403 is rotated by this, the hook 40 also rotates together. Also, beneath the hook 40 is provided with a coil spring 404 to apply a power upward to putting up the hook 40, and the hook 40 moves upward to the upper portion of the shaft 403 due to the applied power of the coil spring 404 in the condition without a restriction by the cam groove 401 and the pin 402.

The relationship between the cam groove 401 and the pin 402 shown in FIG. 11 is as below. Note that FIGS. 9A and 9B shows a state where the hook 40 is rotated from the first 0-degree to 45-degree in the 90-degree rotation, while FIGS. 10A and 10B show a state of the remaining 45 to 90-degree. When the hook 40 is closed by rotating the shaft 403 by 90-degree by the link mechanism 42, the customer tray KST is held during the first part of rotation up to 45-degree, the held customer tray KST is gradually put up during the remaining 45-degree rotation, and finally the hook 40 is released, as a result, the customer tray KST is pressed against the back surface of the tray magazine plate 34 due to the elasticity of the coil spring 404.

A relative relationship of the cam groove 401 and the pin 402 is shown in FIG. 11, wherein the relative movement of the pin 402 is shown for easier understanding of this figure despite the fact that the pin 402 does not move and the hook 40 rotates on which the cam groove 401 is formed.

As shown in FIG. 11, when closing the hook 40, the initial position of the pin is at 402A. And the position after rotating by 45-degree is 402B. Since the cam groove 401 is horizontal from the position 402A to the position 402B, the hook 40 only rotates together with the shaft 403 and does not move upward nor downward.

During the rotation from the position 402B to the position 402C, the hook 40 elevates by exactly h1 with respect to the shaft 403 due to the joints of the cam groove 401 and the pin 402. When the pin 402 reaches to the position 402C, it further reaches to the position 402D due to the elasticity of the coil spring 404, and the hook 40 is released. As a result, as shown in FIGS. 10A and 10B, the customer tray KST is pressed against the back surface of the tray magazine plate 34.

Inversely, when opening the hook 40, the pin 402 relatively moves from the position 402D to 402B to 402A.

In this way, according to the tray transfer arm 205 of the present embodiment, the opening surface of customer trays KST having different shapes in the thickness, etc. can be also pressed against the back surface of the tray magazine plate 34, therefore, the DUTs can be stabilized without jumping out from the pocket. Accordingly, a high speed transfer becomes possible and disadvantages, such as a pick-up mistake, etc. in the next process, can be prevented beforehand.

Note that the embodiments explained above were described to facilitate the understanding of the present invention and not to limit the present invention.

Accordingly, elements disclosed in the above. embodiments include all design modifications and equivalents belonging to the technical field of the present invention.

For example, in the above embodiment, it is necessary to prepare the cover plate 35 as an exclusive member. However, instead of such a cover plate 35, by installing and using a same kind of customer tray KST itself to the tray magazine plate 34, it is possible to prevent DUTs from jumping out.

What is claimed is:

1. An electronic component testing apparatus, comprising:
   a tray magazine for carrying a tray having a pocket for loading an electronic component to be testing therein; and
   a tray transfer arm for transferring the tray carried in said tray magazine to a loader section of the testing apparatus, said tray transfer arm having a cover plate for covering an opening surface of the pocket.

2. The electronic component testing apparatus according to claim 1, wherein the cover plate is movably mounted on the tray transfer arm such that the cover plate is movable relative to the arm, the cover plate engaging the tray when covering the opening surface of the pocket.

3. The electronic component testing apparatus according to claim 2, wherein an amount the cover plate moves relative to the tray transfer arm is variable so that different sized trays can be accommodated on the tray transfer arm.

4. The electronic component testing apparatus according to claim 3, wherein the cover plate engages a top surface of the tray and wherein the cover plate is detachable from the tray transfer arm.

5. The electronic component testing apparatus according to claim 3, further comprising a hook mechanism for holding the tray against the cover plate during transport of the tray, the hook mechanism being pivotable about an axis generally perpendicular to the cover plate.

6. The electronic component testing apparatus according to claim 1, further comprising a hook mechanism for holding the tray against the cover plate during transport of the tray, the hook mechanism being pivotable about an axis generally perpendicular to the cover plate.

7. The electronic component testing apparatus according to claim 6, wherein the cover plate engages a top surface of the tray and wherein the cover plate is detachable from the tray transfer arm.

8. The electronic component testing apparatus according to claim 1, further comprising a first movement device for raising and lowering the tray transfer arm and a second movement device for horizontally moving the tray transfer arm, the cover plate being movable independently of the first and second movement devices.

9. An electronic component testing apparatus, comprising:
   a tray magazine for carrying therein a tray having a pocket for loading an electronic component therein; and
   a tray transfer arm for transferring a tray loaded with post-test electronic components at an unloader section to said tray magazine of the testing apparatus, said tray transfer arm having a cover plate for covering an opening surface of the pocket.

10. The electronic component testing apparatus according to claim 9, wherein the cover plate is movably mounted on the tray transfer arm such that the cover plate is movable relative to the arm, the cover plate engaging the tray when covering the opening surface of the pocket.

11. The electronic component testing apparatus according to claim 10, wherein an amount the cover plate moves relative to the tray transfer arm is variable so that different sized trays can be accommodated on the tray transfer arm.

12. The electronic component testing apparatus according to claim 11, wherein the cover plate engages a top surface of the tray and wherein the cover plate is detachable from the tray transfer arm.

13. The electronic component testing apparatus according to claim 11, further comprising a hook mechanism for holding the tray against the cover plate during transport of the tray, the hook mechanism being pivotable about an axis generally perpendicular to the cover plate.

14. The electronic component testing apparatus according to claim 9, further comprising a hook mechanism for holding the tray against the cover plate during transport of the tray, the hook mechanism being pivotable about an axis generally perpendicular to the cover plate.

15. The electronic component testing apparatus according to claim 14, wherein the cover plate engages a top surface of the tray and wherein the cover plate is detachable from the tray transfer arm.

16. The electronic component testing apparatus according to claim 9, further comprising a first movement device for raising and lowering the tray transfer arm and a second movement device for horizontally moving the tray transfer arm, the cover plate being movable independently of the first and second movement devices.

* * * * *